(12) United States Patent
Shih et al.

(10) Patent No.: US 7,560,762 B2
(45) Date of Patent: Jul. 14, 2009

(54) ASYMMETRIC FLOATING GATE NAND FLASH MEMORY

(75) Inventors: Yen-Hao Shih, Changhua County (TW); Chia-Hua Ho, Kaohsiung (TW); Hang-Ting Lue, Hsinchu (TW); Erh-Kun Lai, Taichung County (TW); Kuang Yeu Hsieh, Hsin Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 434 days.

(21) Appl. No.: 11/209,437

(22) Filed: Aug. 23, 2005

(65) Prior Publication Data

US 2007/0090442 A1    Apr. 26, 2007

(51) Int. Cl.
*H01L 29/80*    (2006.01)
(52) U.S. Cl. ...................................... 257/314; 257/288
(58) Field of Classification Search ................ 257/314, 257/288
See application file for complete search history.

(56) References Cited

U.S. PATENT DOCUMENTS

| 4,939,690 | A | 7/1990 | Momodomi | |
| 6,251,727 | B1 | 6/2001 | Chen | |
| 6,291,297 | B1 | 9/2001 | Chen | |
| 6,809,372 | B2 * | 10/2004 | Gambino et al. | 257/315 |
| 7,294,903 | B2 * | 11/2007 | Tran | 257/510 |
| 7,307,905 | B2 * | 12/2007 | Najm et al. | 365/205 |

FOREIGN PATENT DOCUMENTS

JP    11-284086    10/1995

OTHER PUBLICATIONS

Cheng-Yuan Hsu, "Split-Gate NAND Flash Memory at 120nm Technology Node Featuring Fast Programming and Erase", 2004 Symposium on VLSI Technology, Digest of Technical Papers, pp. 78-79, © 2004 IEEE.

* cited by examiner

*Primary Examiner*—Roy K Potter
(74) *Attorney, Agent, or Firm*—Jianq Chyun IP Office

(57) ABSTRACT

A NAND-type flash memory device includes asymmetric floating gates overlying respective wordlines. A given floating gate is sufficiently coupled to its respective wordline such that a large gate (i.e., wordline) bias voltage will couple the floating gate with a voltage which can invert the channel under the floating gate. The inversion channel under the floating gate can thus serve as the source/drain. As a result, the memory device does not need a shallow junction, or an assist-gate. In addition, the memory device exhibits relatively low floating gate-to-floating gate (FG-FG) interference.

10 Claims, 12 Drawing Sheets

Cell to be read

ASYMMETRIC FLOATING GATE NAND FLASH MEMORY

BACKGROUND OF THE INVENTION

1. Field of the Invention

The present invention relates generally to floating gate flash memory with an asymmetric floating gate and a method of fabricating and operating such a memory.

2. Background of the Invention

There is a continuing desire to improve density of semiconductor devices, especially semiconductor memory devices. In this regard, there have been advances in flash memory, and particularly NAND-type flash memory, providing for higher density, lower cost-per-bit, and higher programming throughput.

Some prior art NAND-type flash memory structures, like that described in U.S. Pat. No. 4,939,690, require shallow junctions that are formed in the surface of a substrate in such a way that the shallow junctions somewhat overlap gates of transistors that overlie the shallow junctions. The shallow junctions serve as source and drain regions for corresponding transistors, and are used as regions from which electrons can be injected, typically through an oxide layer, into corresponding floating gates. Of course, such shallow junctions require additional doping steps in the manufacturing process, and there is a limit to how much such a structure can be reduced in size in an effort to increase the overall density of the device.

This particular prior art NAND-type flash memory structure also exhibits unfavorable floating gate interference. In order to control floating gates through poly wordlines, floating gates are made thick to increase the contact area between the floating gates and the wordlines. When devices are shrunk, spaces between the floating gates are also reduced. Consequently, floating gates are more susceptible to interfering with each other, leading to so-called "floating gate interference"

Another, more recent, NAND-type flash memory technology is described in Hsu et al., "Split-Gate NAND Flash Memory at 120 nm Technology Node Featuring Fast Programming and Erase," 2004 Symposium on VLSI Technology. This memory structure is characterized by having a split structure in which each memory cell has associated therewith two wordlines that control, respectively, a select gate and a control gate to manipulate (erase, program, read) an associated floating gate.

The above Split-Gate flash memory device relies on capacitive coupling between the floating gate and the wordline. However, the area between the floating gate and the wordline is small. Therefore, the structure described in this reference exhibits a low coupling ratio, which is defined as the capacitance between the floating gate and its control gate divided by the total capacitance of the floating gate to its surrounding environment.

This particular technology operates using hot carrier injection. This type of operation, while it is much faster, consumes more power than Fowler-Nordheim (FN) operation.

Thus, while there have been advances in NAND-type flash memory devices, there is still a need to further improve this technology.

BRIEF SUMMARY OF THE INVENTION

The present invention provides a unique NAND-type flash memory device that includes an asymmetric floating gate that exhibits a relatively high gate coupling ratio (CGR). As a result the device does not require shallow junctions or an assist-gate. In addition, there is relatively low floating gate-to-floating gate (FG-FG) interference.

In accordance with one embodiment of the invention there is provided a substrate, a plurality of wordlines disposed on and electrically insulated from the substrate, and floating gates asymmetrically overlying respective wordlines. The floating gates, also preferably overlie areas between the wordlines, and are separated from the substrate by a tunnel oxide.

A coupling ratio between a given one of the wordlines and its corresponding floating gate is sufficiently strong to induce an inversion channel below the corresponding floating gate.

Also, in accordance with an exemplary embodiment, an oxide layer between the substrate and a given one of the wordlines is thicker than an oxide layer between the substrate and a corresponding floating gate.

The minimum cell size in the device is $4F^2$.

The memory device is preferably operated as a NAND-type flash memory.

A method of fabricating a floating gate memory device according to an embodiment of the invention includes providing a substrate, forming a first oxide layer on the substrate, depositing a first layer of polysilicon on the first oxide layer, and selectively etching the polysilicon layer and the first oxide layer to create wordlines. Thereafter, the method includes forming a second oxide layer over exposed surfaces of the wordlines and the substrate, depositing a second layer of polysilicon on the second oxide layer, patterning the second layer of polysilicon, forming a third oxide layer on the second layer of polysilicon, depositing a fourth oxide layer via high density plasma deposition, removing portions of the fourth and third oxide layers; and selectively etching remaining portions of the fourth oxide layer, the third oxide layer and the second polysilicon layer, leaving an asymmetric floating gate associated with each of the wordlines.

The method further includes depositing an interlevel dielectric (ILD), removing portions of the ILD and an underlying structure down to the substrate, and forming source/drain regions, and electrically connecting a metal line deposited on the ILD to the source/drain regions.

These and other features of the present invention, and their attendant advantages will be more fully described in the following detailed description in conjunction with associated drawings.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

FIGS. 1A-K show semiconductor processing steps for making an asymmetric floating gate NAND-type flash memory according to the present invention. A description of the operation of the completed device and its operation will then be presented.

Figure 1A:
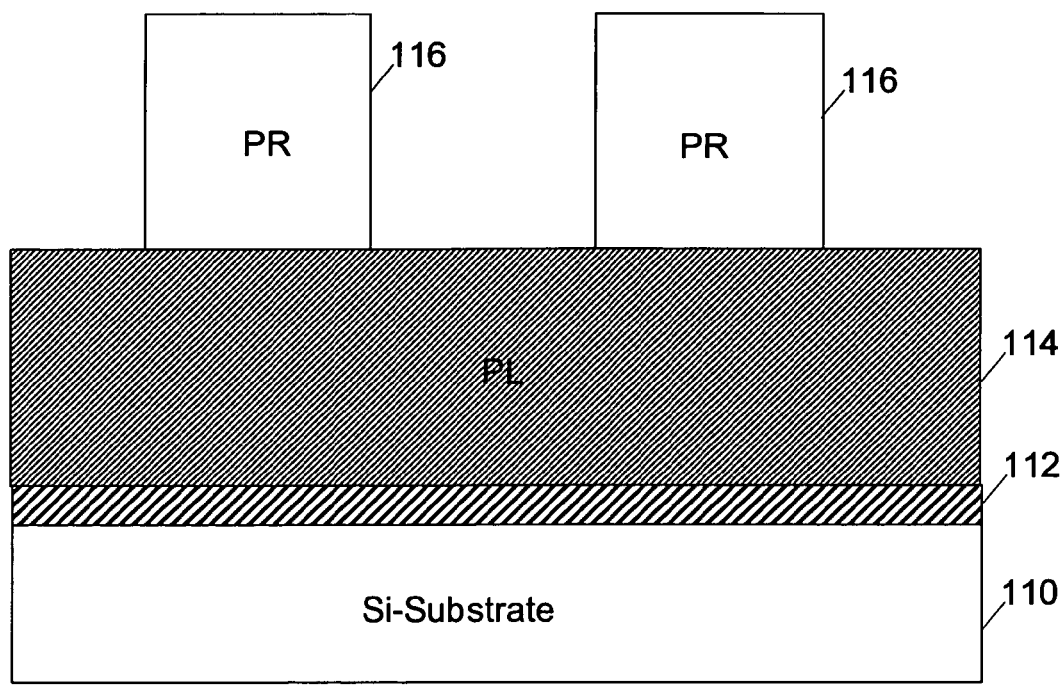
FIGS. 1A-K depict processing steps for making an asymmetric floating gate NAND-type flash memory in accordance with the present invention.
Figure 1B:
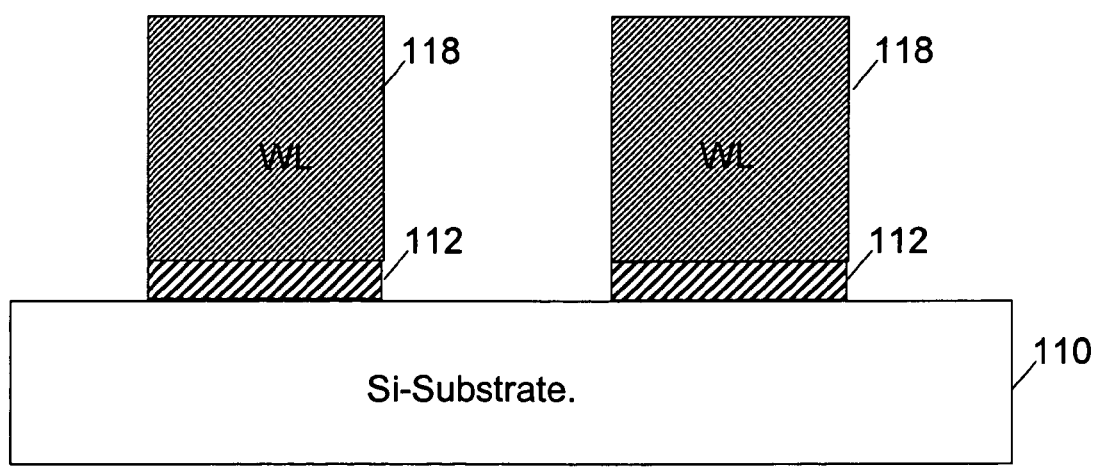

Referring to FIG. 1A, a gate oxide layer 112 is formed on a silicon substrate 110, and a layer of polysilicon 114 is formed over gate oxide layer 112. A photoresist (PR) layer 116 is then applied, using, e.g., well-known photolithography techniques, and the combination is then etched resulting in the configuration shown in FIG. 1B. As shown, etched polysilicon (PL) layer 114 becomes a plurality of wordlines (WL) 118 separated from silicon substrate 110 by gate oxide 112.

Figure 1C:
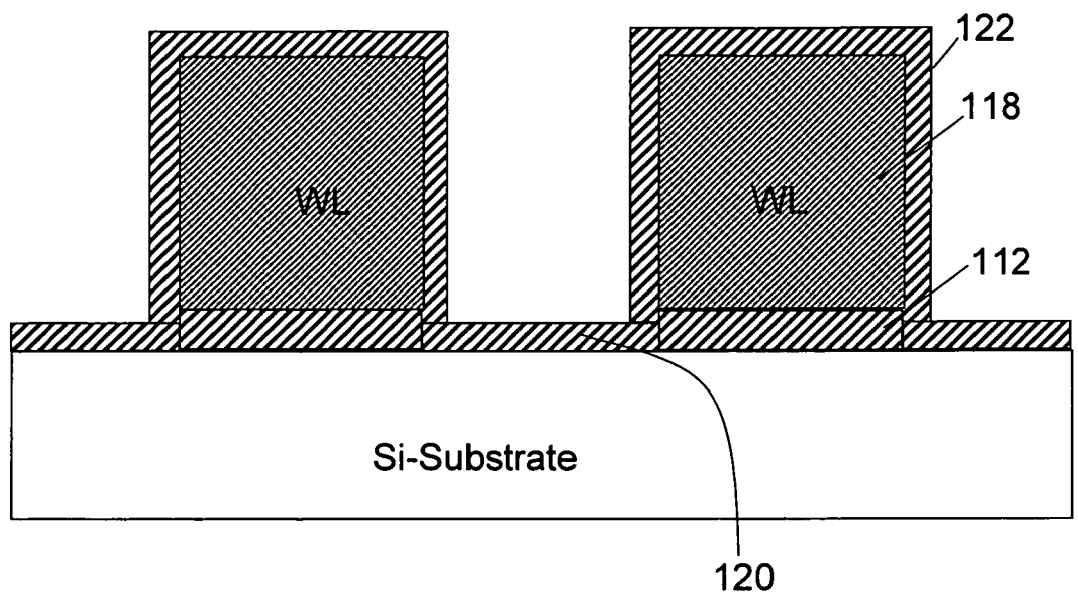

Then, as shown in FIG. 1C an oxide layer is formed directly on silicon substrate 110 between wordlines 118, and around exposed surfaces of the polysilicon wordlines 118. The oxide layer formed between adjacent wordlines and directly on silicon substrate 110 becomes a tunnel oxide layer 120 through which electrons pass to program a floating gate (not yet shown), and the oxide layer 122 formed on the exposed surfaces of wordlines 118 is provided to electrically insulate the individual wordlines 118 from each other and other parts of the memory device. In an exemplary embodiment, the thickness of tunnel oxide layer 120 is less than that of gate oxide layer 112.

Figure 1D:
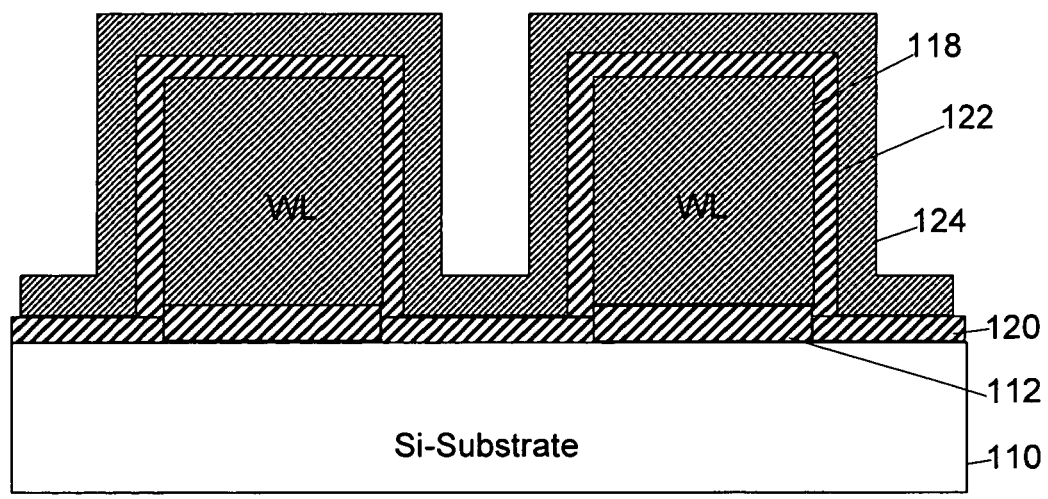
Figure 1E:
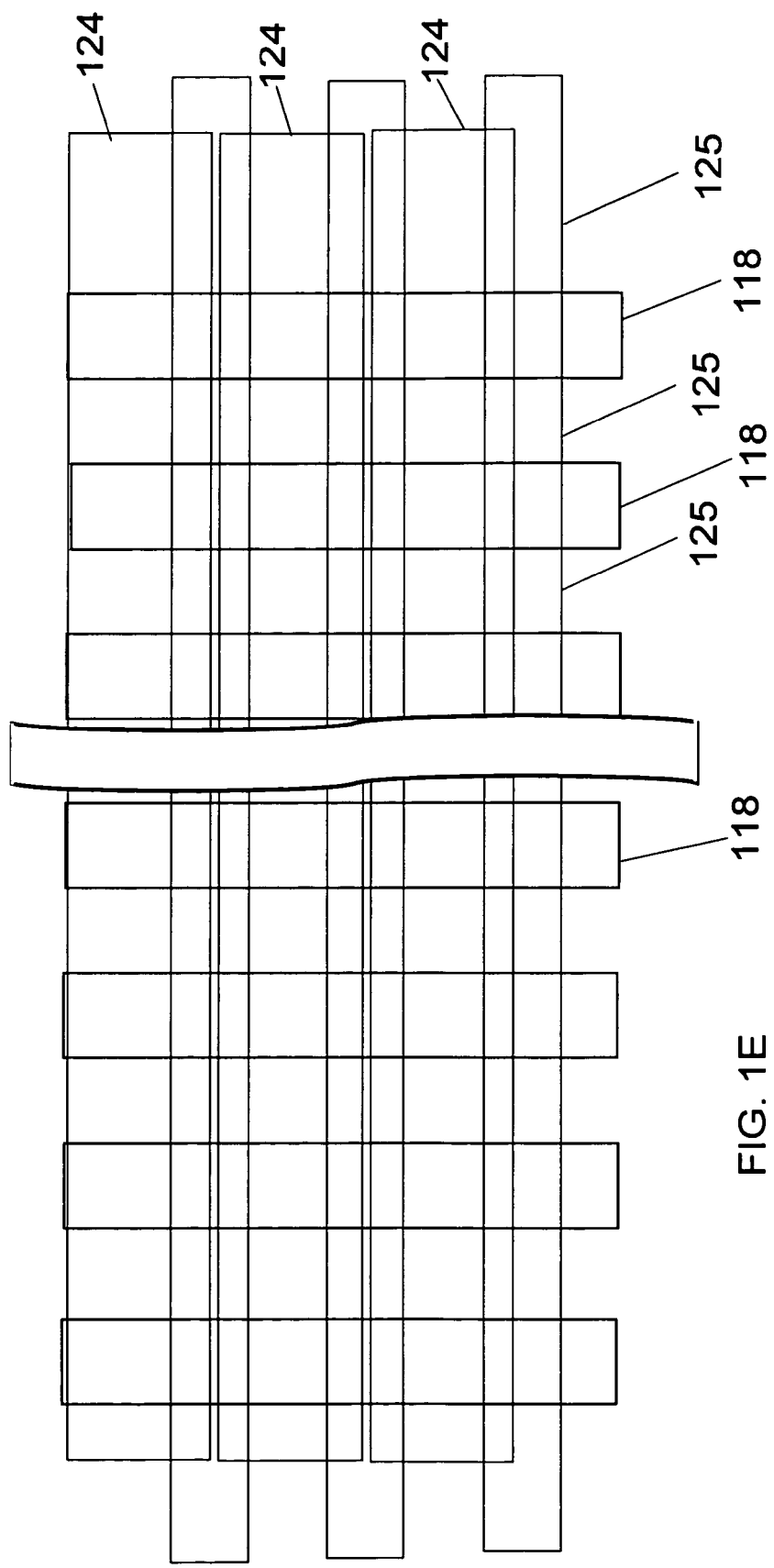

In a subsequent processing step, as shown in FIG. 1D, a thin polysilicon layer 124 is formed over the entire structure. Layer 124 will, after further processing, become the respective floating gates of individual memory cells. FIG. 1E is a plan view of the stage of manufacture shown in FIG. 1D after a patterning step comprising shallow trench isolation (STI) 125 of polysilicon layer 124.

Figure 1F:
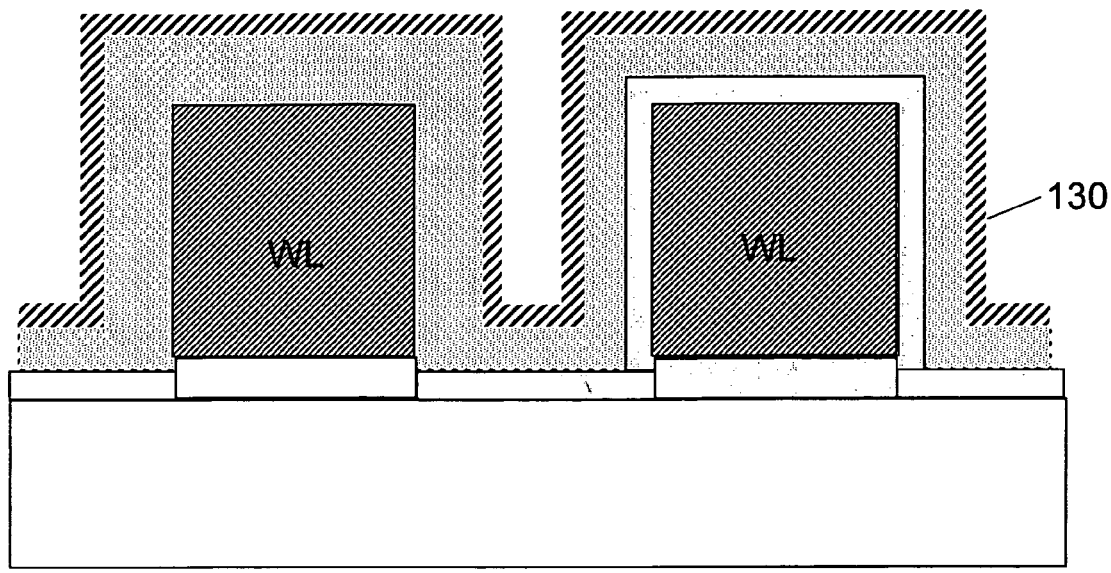
Figure 1G:
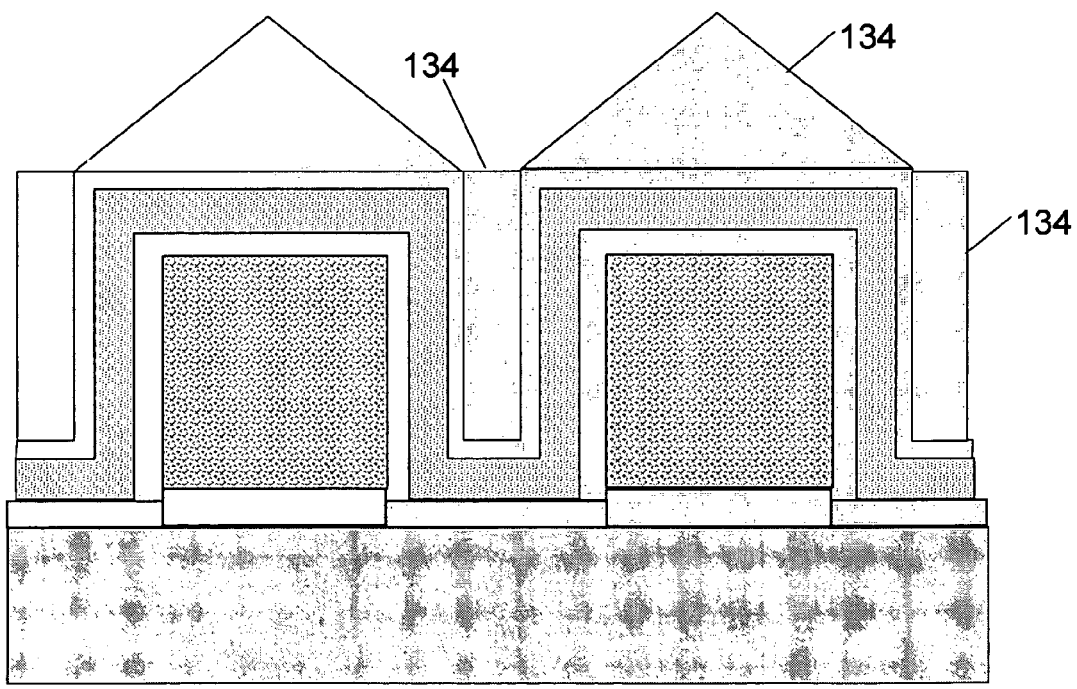
Figure 1H:
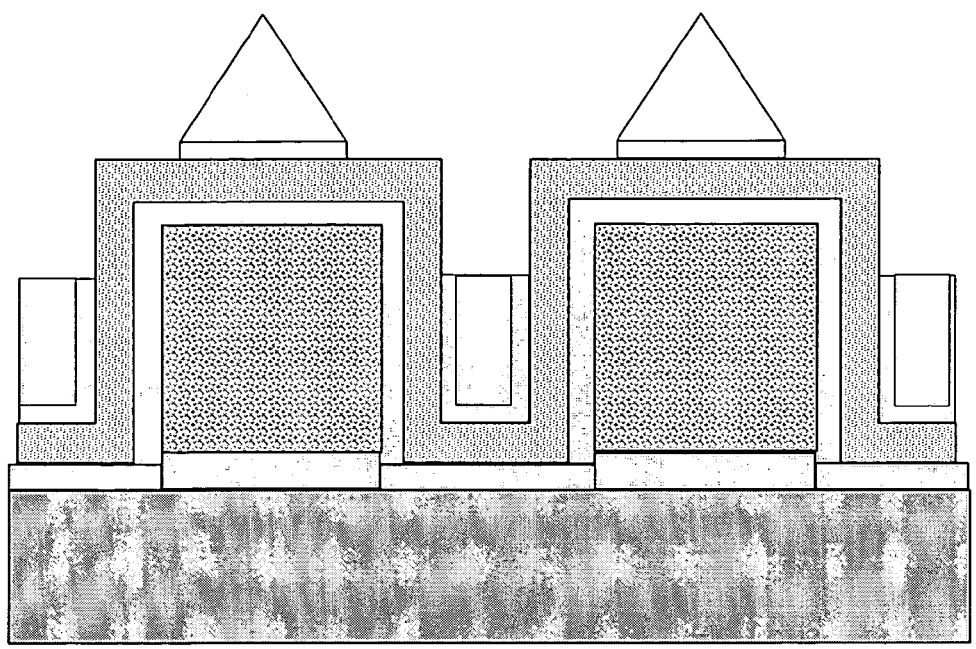

FIG. 1F shows the formation of another oxidation layer 130 over polysilicon layer 124. In a subsequent processing step, shown in FIG. 1G, a high density plasma (HDP) oxide 134 is deposited in the open volume between wordlines 118 and on top of each of the wordlines 118. HDP oxide 134 is then subjected to a hydrofluoric acid (HF) dip with the result depicted in FIG. 1H.

Figure 1I:
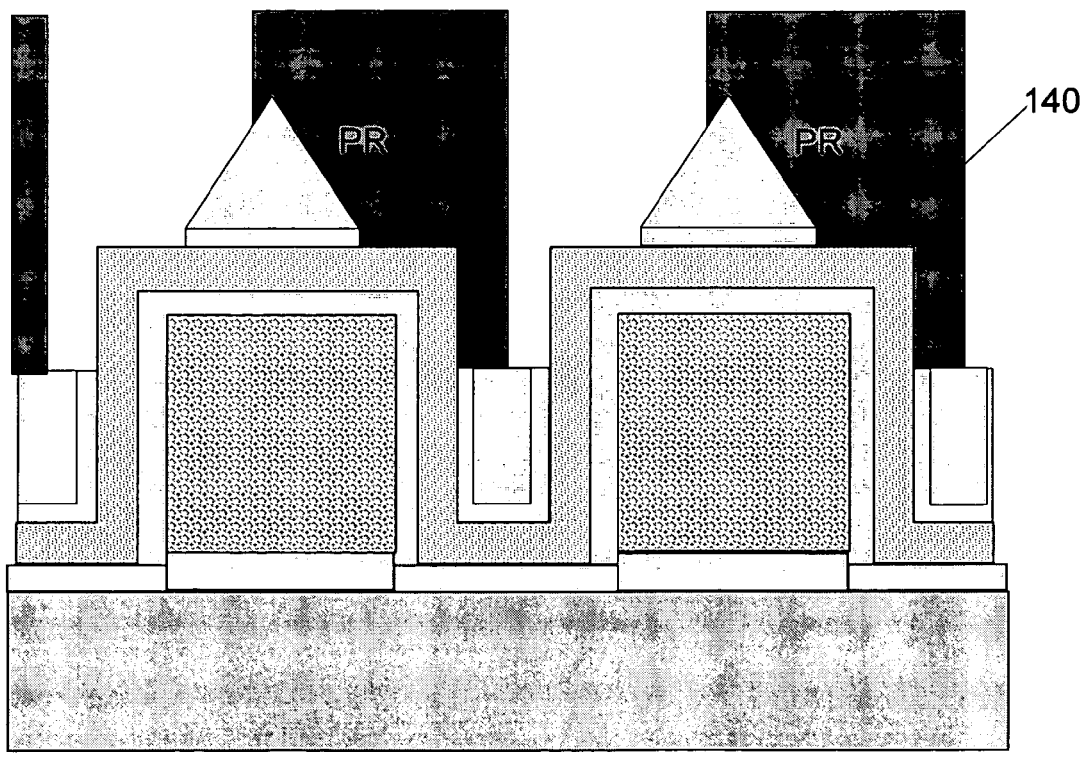
Figure 1J:
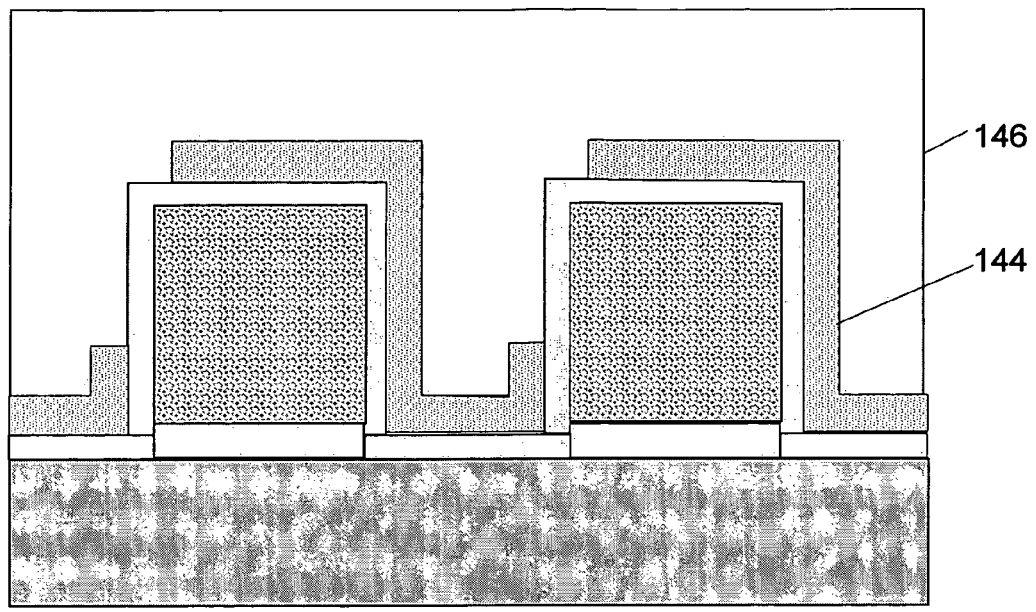

In a subsequent manufacturing step, a photoresist 140 is applied to selected portions of the structure, as shown in FIG. 1I. This structure is then etched such that portions of polysilicon layer 124 not protected by HDP oxide 134 or photoresist 140 are etched away, resulting in an asymmetrical gate 144 associated with each wordline 118. Photoresist 140 is then removed, as are any remnants of HDP oxide 134, and an interlevel dielectric (ILD) 146, as shown in FIG. 1J, is formed to cover the entire structure.

Figure 1K:
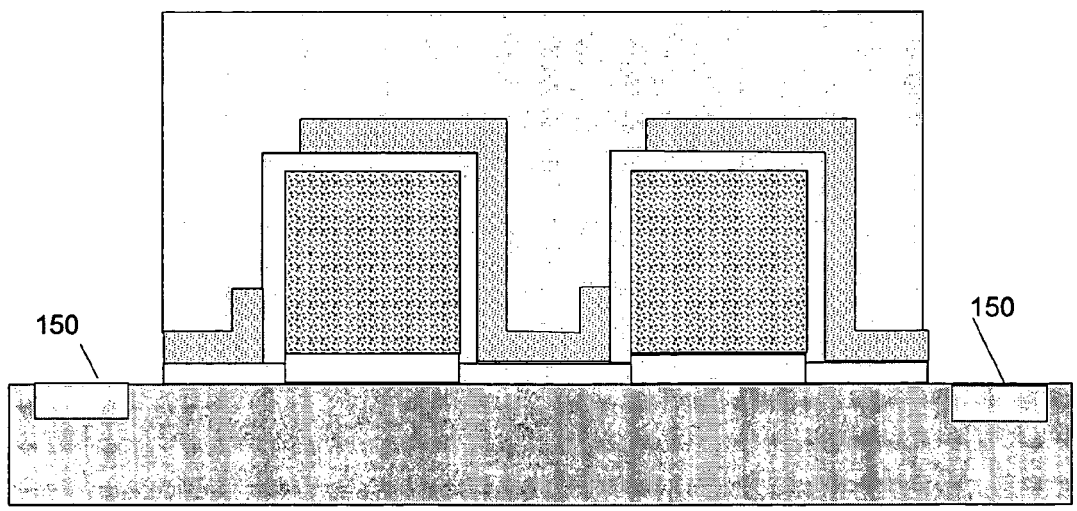

Then, as shown in FIG. 1K, ILD 146 and any structure there under is then selectively removed down to substrate 110 and source/drain 150 is formed in substrate 110.

Figure 2:
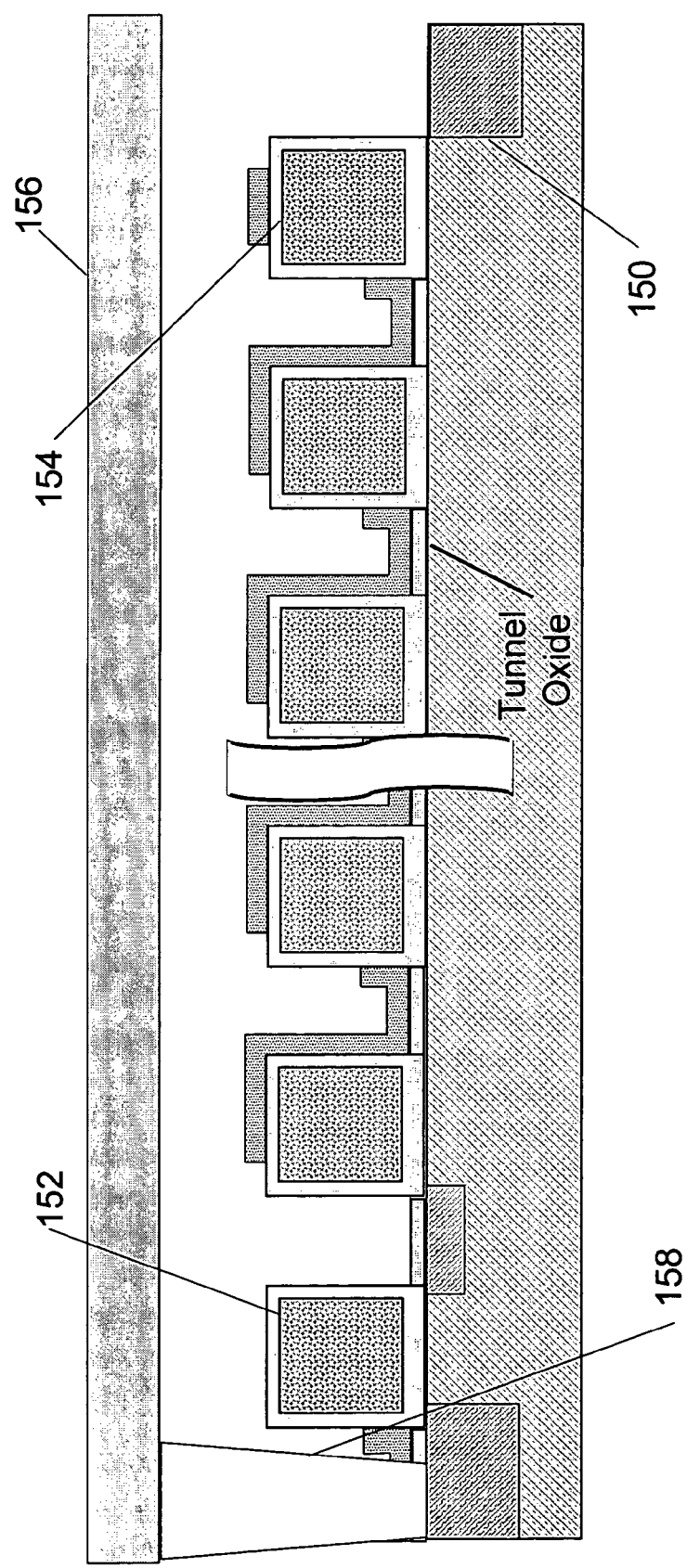
FIGS. 2 and 3 are, respectively, cross-sectional and plan views of the asymmetric floating gate NAND-type flash memory in accordance with the present invention.
Figure 3:
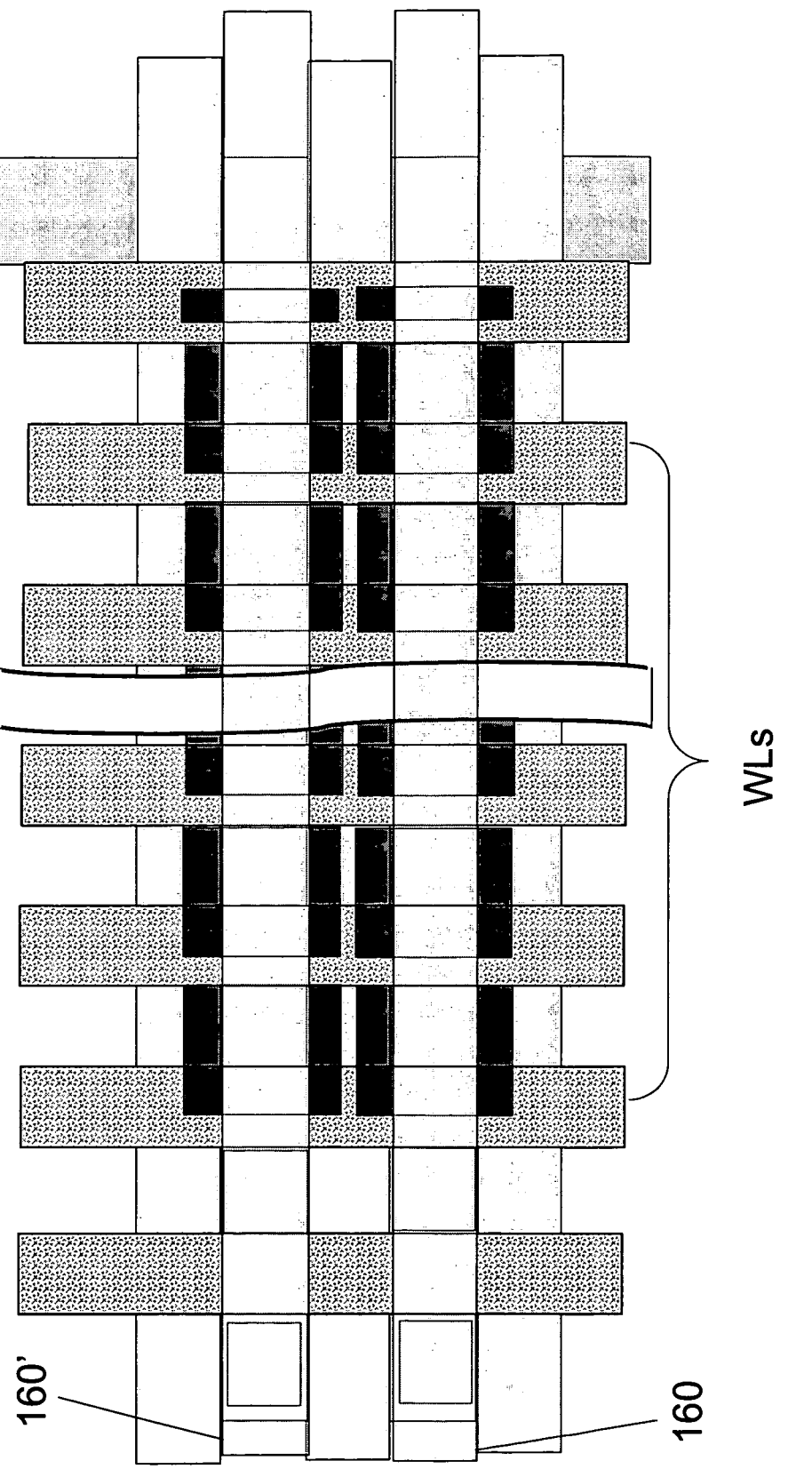

A final cross-sectional view of a NAND string in accordance with the present invention is depicted in FIG. 2, and a plan view of the same device is shown in FIG. 3. These figures also show the inclusion of a source select line (SSL) 152, ground select line (GSL) 154, metal line (ML) 156 and via 158 connecting metal line 156 with given bit lines 160, 160'.

Figure 4:
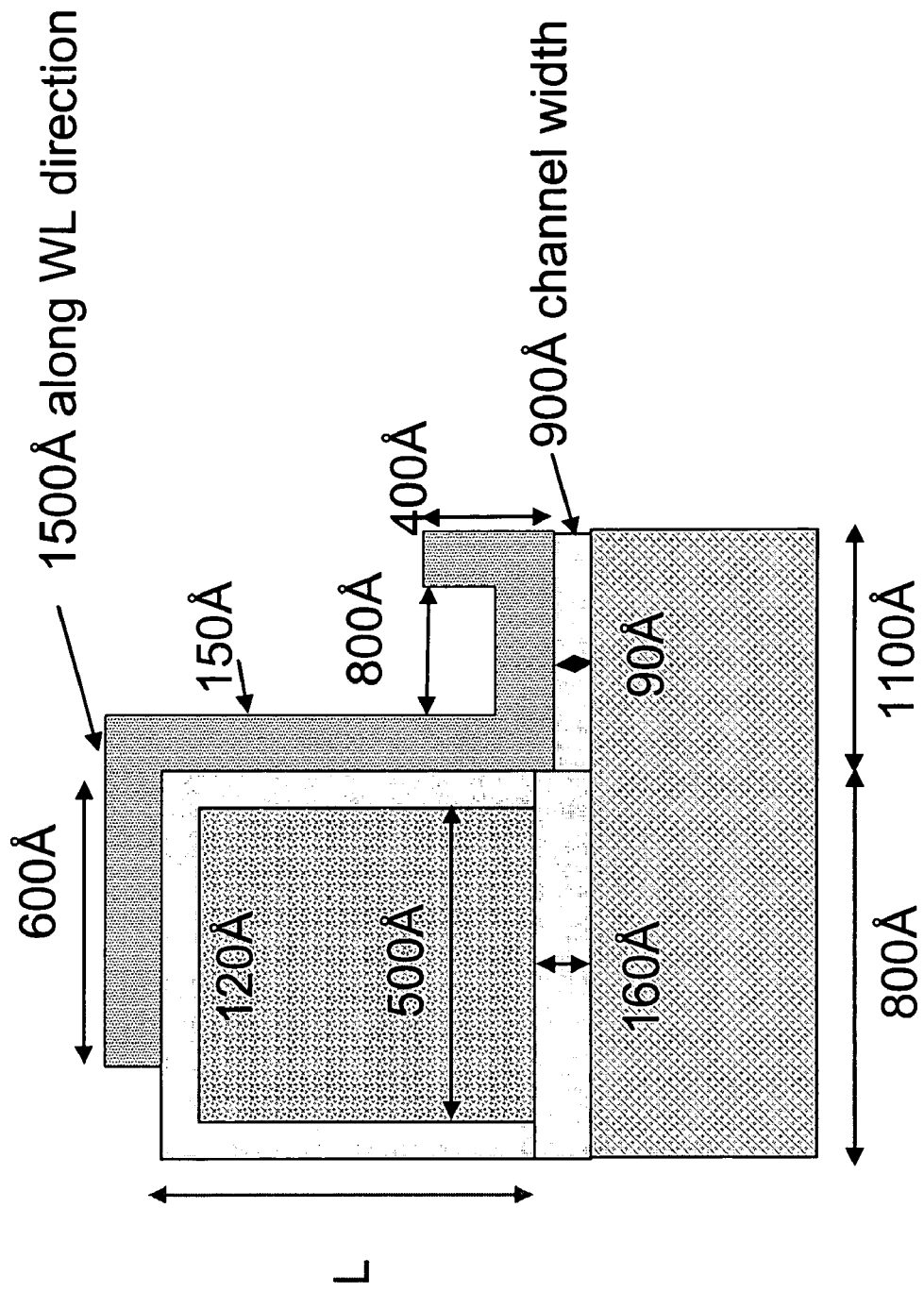
FIG. 4 shows exemplary dimensions of a memory cell in accordance with the present invention.

FIG. 4 shows exemplary dimensions of a memory cell that impact the device's gate coupling ratio (GCR) and FG-FG interference. With the exemplary dimensions shown, the measured capacitances are as follows:

$C_{channel}$=3.8E-17 (F)

$C_{FG-WL-Top}$=2.59E-17 (F)

$C_{FG-WL-Side}$=10.79E-17 (F) (with L=250 nm)

$C_{FG-WL'-Side}$=1.73E-17 (F)

These capacitances lead to the following gate coupling ratios (GCRs) for the different wordline (L) dimensions.

GCR=0.67 (L=200 nm)

GCR=0.708 (L=250 nm)

And, for any two adjacent floating gates, the capacitance is as follows:

$C_{FG-FG}$=0.88E-17 (F)@L=250 nm, which is relatively low FG-FG interference.

Figure 5:
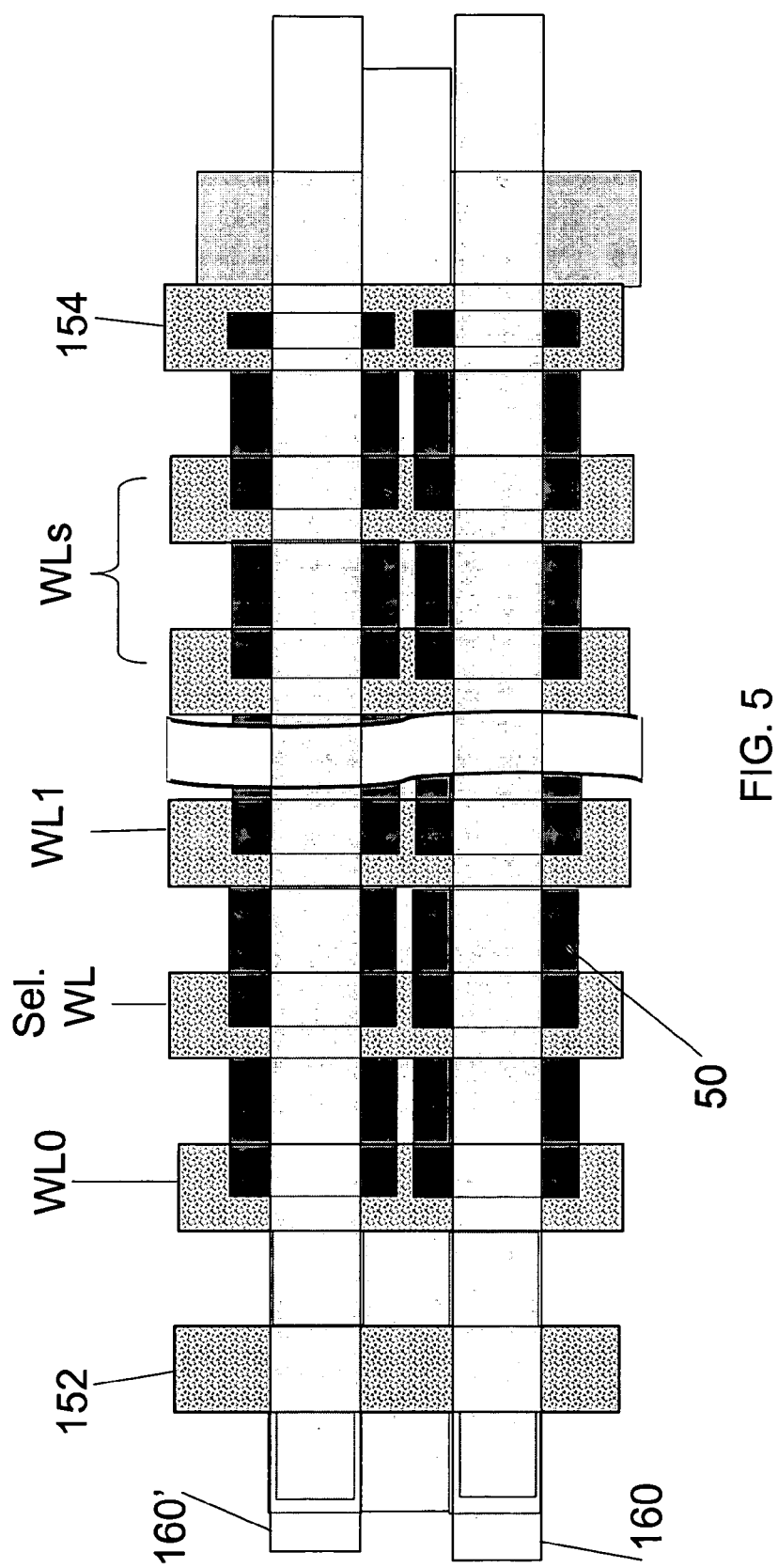
FIG. 5, in combination with Table 1, provides details of the operation of the asymmetric floating gate NAND-type flash memory in accordance with the present invention.

FIG. 5, in combination with Table 1 below, provides details of the operation of the asymmetric floating gate NAND-type flash memory in accordance with the present invention.

TABLE 1

| MODE | Sel. WL | Pass WL | SSL | GSL | BL | BL' | Bulk |
|---|---|---|---|---|---|---|---|
| READ | 3.3 V | 5 V | 3.3 V | 3.3 V | 1.5 V | 1.5 V | 0 V |
| Prog. | 15.5~20 V | 10 V | 3.3 V | 0 V | 0 V | 3.3 V | 0 V |
| Erase | −10 V | −10 V | Float | Float | Float | Float | 10 V |

Specifically, to erase all of the memory cells in an array of cells, all wordlines are applied with a negative bias, −10V in example, SSL, GSL, BL and BL' are floated, and silicon substrate 110 is biased to +10 volts. This causes, due to Fowler-Nordheim (FN) tunneling, electrons to be injected through tunnel oxide 112 back into silicon substrate 110, thereby causing all memory cells to be erased.

To program, e.g., floating gate 50 in FIG. 5, the selected wordline is biased to 15.5-20 volts, all other wordlines are biased to 10 volts, SSL is biased to 3.3 volts, GSL and the bit line in which floating gate 50 is located are grounded, other bit lines are biased to 3.3 volts, and the substrate is grounded. With this biasing scheme, electrons present in the channel are injected into the floating gate, thereby placing the floating gate into a programmed state.

To read floating gate 50 in FIG. 5, the selected wordline is biased to 3.3 volts, all other wordlines are biased to 5 volts (to turn ON the channels in the rest of the word lines being read), SSL and GSL are biased to 3.3 volts, all bit lines are biased to 1.5 volts, and the substrate is grounded. If floating gate 50 is in an erase state, namely, then the channel beneath floating gate 50 will be ON, and a current will be sensed through the bit line. If no current is sensed, then the selected floating gate 50, is not sufficiently positively charged and is, accordingly, deemed to be programmed to high Vt.

Figure 6A:
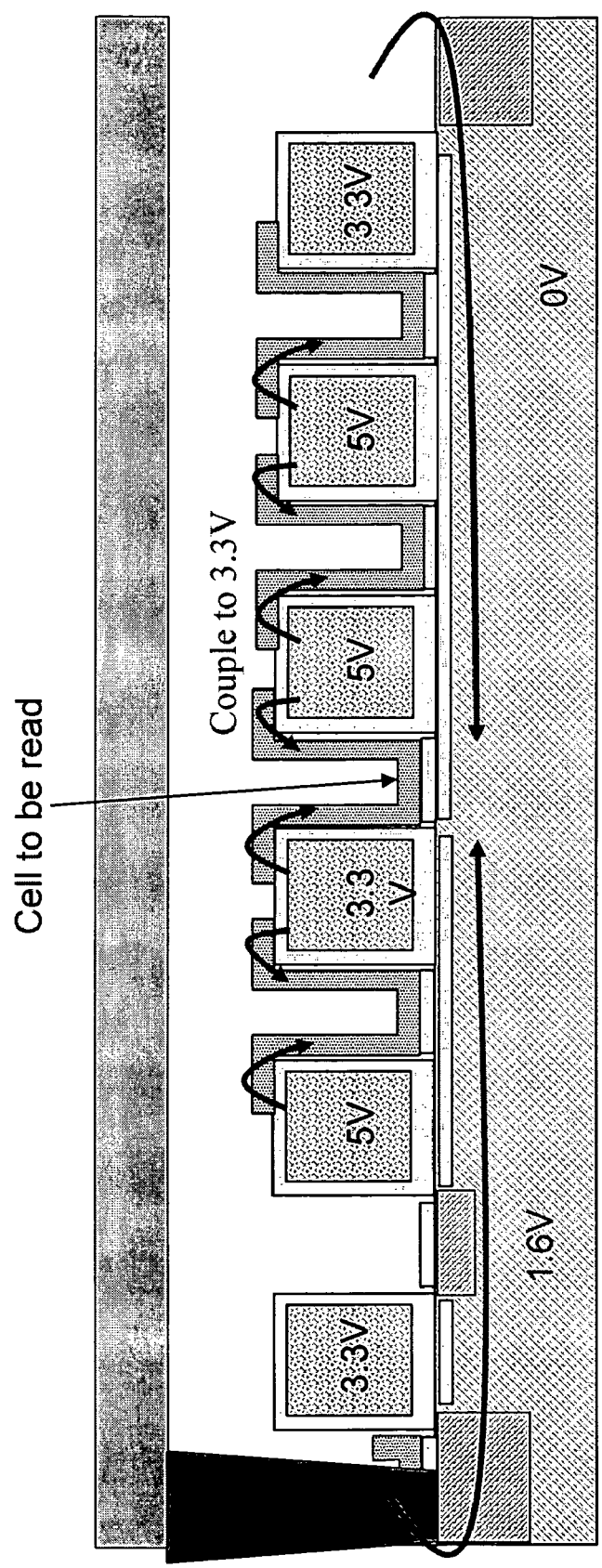
FIGS. 6A and 6B show a comparison between a symmetric floating gate and an asymmetric floating gate.
Figure 6B:
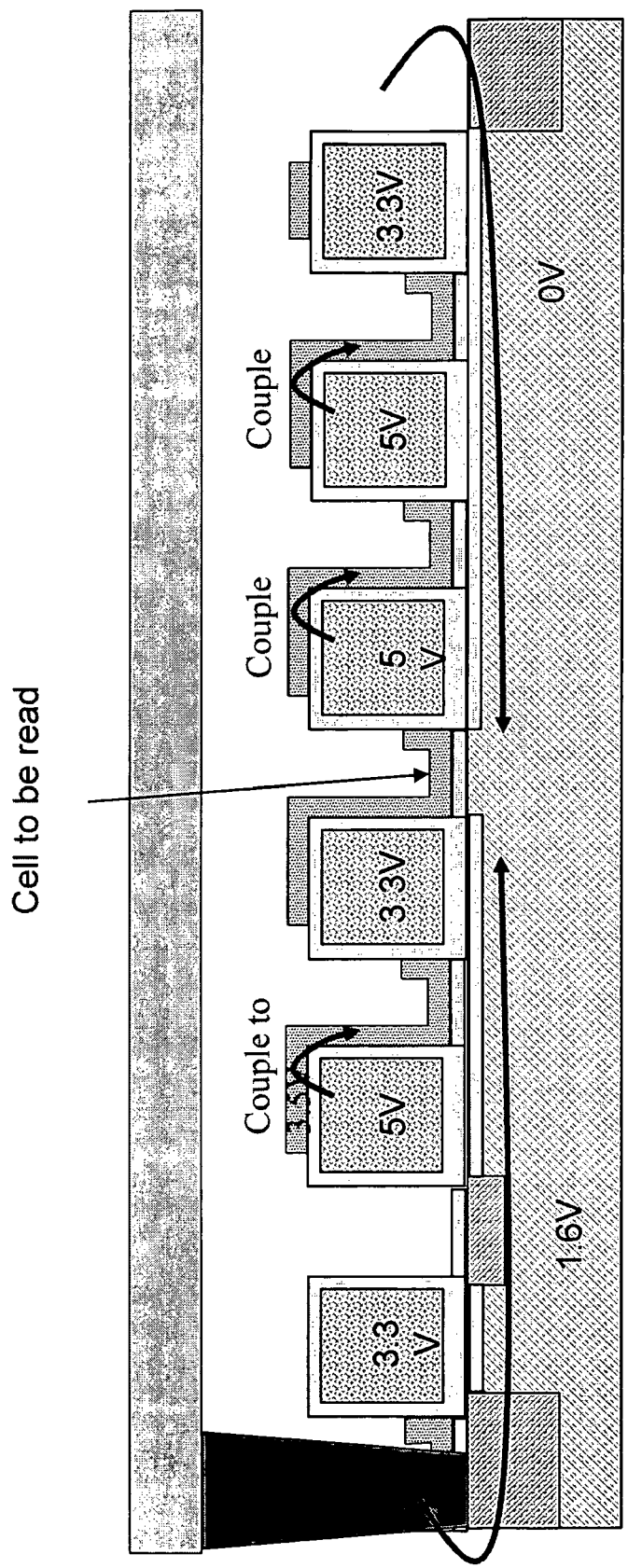

FIGS. 6A and 6B compare a read operation in a symmetric floating gate structure and an asymmetric floating gate structure consistent with the principles of the present invention to help explain the concept behind the present invention. In FIG. 6A, it is shown that the selected wordline is biased only to 3.3 volts, while the non-selected wordlines are biased to 5 volts, in accordance with the reading operation biasing scheme described above. However, the 5 volt biasing voltage applied to a non-selected wordline adjacent the selected wordline will cause the channel beneath the selected floating gate to be turned ON. Consequently, it cannot be determined if the floating gate is or is not programmed.

In contrast, with an asymmetric floating gate, and in reference to FIG. 6B, the 5 volt biasing voltage of an adjacent non-selected wordline is not sufficiently coupled to the selected floating gate. That is, each floating gate, because of its asymmetrical configuration, is isolated from adjacent wordlines such that it is possible to determine whether current flowing in the corresponding channel is a result of a programmed floating gate, rather than interference, caused by other wordlines, that is causing the channel beneath the floating gate to be ON.

In view of the foregoing, those skilled in the art will appreciate that in the present invention, the wordlines serve as the control gates as well as the assist gate. Hence, in the device of the present invention there is no need to double the worldline density to fabricate assist gates.

Additionally, no shallow junction is needed. The asymmetric control gate itself can cause an inversion channel to couple source/drain bias into the device. More specifically, as in the prior art, when a large gate bias is applied to a control gate, it will induce an inversion channel under the gate insulator. Since the coupling ratio in the present invention is high, a large gate (i.e., wordline) bias will couple the floating gate with a voltage which can invert the channel under the floating gate. The inversion channel under the floating gate can thus serve as the source/drain. As a result, the memory of the present invention does not need a shallow junction.

Furthermore, the minimum cell size of the memory structure described herein is $4F^2$, which, along with no requirement for shallow junctions, is particularly desirable for device shrinkage.

Finally, the device according to the present invention exhibits a high coupling ratio and a large operation window. Because of the high coupling ratio of this invention, floating gates are more easily be FN programmed and erased. Also, for a fixed programming/erase bias and duration, the Vt operation window can be enlarged with such high gate coupling ratio design.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A memory device, comprising:
   a substrate;
   a plurality of wordlines disposed on and electrically insulated from the substrate;
   and floating gates asymmetrically overlying respective wordlines, wherein a coupling ratio between a given one of the wordlines and its corresponding floating gate is sufficiently strong to induce an inversion channel below the corresponding floating gate.

2. The memory device of claim 1, wherein the floating gates, also overlie areas between the wordlines.

3. The memory device of claim 2, wherein the floating gates are separated from the substrate by a tunnel oxide.

4. The memory device of claim 1, wherein an oxide layer between the substrate and a given one of the wordlines is thicker than an oxide layer between the substrate and a corresponding floating gate.

5. The memory device of claim 1, wherein a minimum cell size is $4F^2$.

6. The memory device of claim 1, wherein the memory device is a NAND-type flash memory.

7. A NAND-type flash memory, comprising:
   a substrate;
   a first wordline and a second wordline spaced from each other and disposed on the substrate by a first oxide layer having a first thickness, the first and second wordlines having bottom, top and side surfaces, wherein the bottom surface of the first and second wordlines are in contact with the first oxide layer;
   a second oxide layer formed over the tops and side surfaces of the first and second wordlines and a surface of the substrate between the first and second wordlines, the second oxide layer being thinner than the first oxide layer; and
   a floating gate formed partially on the second oxide layer on the top surface of the first wordline, formed fully on the second oxide layer on one of the side surfaces of the first wordline, formed fully on the second oxide layer on the surface of the substrate between the first and second wordlines, and formed partially on the second oxide layer on one of the side surfaces of the second wordline that opposes the one of the side surfaces of the first wordline.

8. The NAND-type flash memory of claim 7, wherein the second oxide layer is a tunnel oxide.

9. The NAND-type flash memory of claim 8, wherein a coupling ratio between the first wordline and the floating gate is sufficiently strong to induce an inversion channel in the substrate below the floating gate.

10. The NAND-type flash memory of claim 8, wherein a minimum cell size is $4F^2$.

* * * * *